(12) United States Patent
Queen

(10) Patent No.: US 12,322,524 B2
(45) Date of Patent: Jun. 3, 2025

(54) FLUX-TRAPPING MAGNETIC FILMS IN SUPERCONDUCTING CIRCUITS

(71) Applicant: Daniel Robert Queen, Kensington, MD (US)

(72) Inventor: Daniel Robert Queen, Kensington, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 709 days.

(21) Appl. No.: 17/670,678

(22) Filed: Feb. 14, 2022

(65) Prior Publication Data

US 2023/0260679 A1    Aug. 17, 2023

(51) Int. Cl.
*H01B 12/06* (2006.01)
*H01B 12/16* (2006.01)
(Continued)

(52) U.S. Cl.
CPC ............. *H01B 12/06* (2013.01); *H01B 12/16* (2013.01); *H01F 10/14* (2013.01); *H01F 10/16* (2013.01); *H10N 60/80* (2023.02)

(58) Field of Classification Search
CPC ......... H01B 12/06; H01B 12/16; H01F 10/14; H01F 10/16; H01F 10/123; H01F 41/30; H01F 10/32; H10N 60/80; B82Y 10/00; G06N 10/40; G06N 10/20; H01L 39/12; H01L 21/02; H01L 27/22; G11B 5/02
See application file for complete search history.

(56) References Cited

U.S. PATENT DOCUMENTS

| 2003/0091846 A1* | 5/2003 | Kobayashi | .......... H01F 10/3227 |
|---|---|---|---|
| | | | 204/192.1 |
| 2015/0119253 A1* | 4/2015 | Yohannes | .............. H10N 69/00 |
| | | | 505/190 |

(Continued)

FOREIGN PATENT DOCUMENTS

WO    2021/113513 A1    6/2021

OTHER PUBLICATIONS

Sander, et al.: "Superconducting imprint of magnetic textures in ferromagnets with perpendicular magnetic anisotropy" Sci Rep 11, 20788 (2021). https://doi.org/10.1038/s41598-021-99963-w *pp. 1-10*.

(Continued)

*Primary Examiner* — Jarrett J Stark
(74) *Attorney, Agent, or Firm* — Tarolli, Sundheim, Covell & Tummino LLP

(57) ABSTRACT

One example includes a superconducting circuit. The circuit includes superconducting circuitry fabricated in a circuit layer. The circuit layer includes a first surface and a second surface opposite the first surface. The circuit also includes a flux moat comprising a dielectric material formed in the circuit layer. The flux moat can be configured to trap a magnetic flux as the superconducting circuit is cooled to below a superconducting critical temperature. The circuit further includes a magnetic film arranged proximal to the flux moat on at least one of the first and second surfaces of the circuit layer. The magnetic film can be configured to guide the magnetic flux to the flux moat as the superconducting circuit is cooled to below the superconducting critical temperature.

20 Claims, 2 Drawing Sheets

(51) Int. Cl.
*H01F 10/14* (2006.01)
*H01F 10/16* (2006.01)
*H10N 60/80* (2023.01)

(56) References Cited

U.S. PATENT DOCUMENTS

| | | | |
|---|---|---|---|
| 2018/0308896 A1 | 10/2018 | Ladizinsky et al. | |
| 2020/0287118 A1 | 9/2020 | Herr et al. | |
| 2022/0199687 A1* | 6/2022 | Nowak | H10N 50/10 |
| 2023/0004851 A1* | 1/2023 | Harris | H10N 60/0912 |
| 2023/0411046 A1* | 12/2023 | Przybysz | H01B 12/06 |

OTHER PUBLICATIONS

Semenov, et al.: "How Moats Protect Superconductor Films From Flux Trapping" in IEEE Transactions on Applied Superconductivity, vol. 26, No. 3, pp. 1-10, Apr. 2016, Art No. 1300710, doi: 10.1109/TASC.2016.2547218. Found on the internet at https://www.semanticscholar.org/paper/How-Moats-Protect-Superconductor-Films-From-Flux-Semenov-Khapaev/0f77722802bac3fefb48759d800561e36b235cc3 on Sep. 5, 2023.

Jan, et al.: "Flux pinning enhancement in ferromagnetic and superconducting thin-film multilayers"; Applied Physics Letters; vol. 82, No. 5; Feb. 3, 2003; pp. 1-3.

* cited by examiner

FLUX-TRAPPING MAGNETIC FILMS IN SUPERCONDUCTING CIRCUITS

TECHNICAL FIELD

This description relates generally to electronic circuits, and more particularly to flux-trapping magnetic films for superconducting circuits.

BACKGROUND

Superconducting circuits operate based on the behavior of superconducting metals in a cryogenic environment. For example, at very low cryogenic temperatures (e.g., less than 1K), superconducting metals can exhibit superconductivity in which electrons can propagate with approximately zero resistance. Typical superconducting circuits can operate based on being provided bias currents on bias inputs, such as to affect the triggering of Josephson junctions and/or to provide magnetic flux in superconducting loops. As a superconducting circuit is cooled from a typical ambient temperature environment to a cryogenic temperature, and thus a temperature less than a superconducting critical temperature for superconducting devices, noise currents can exhibit and propagate to the superconducting circuit via the bias inputs. Such noise currents can cause magnetic flux to exhibit on the superconducting loops and can remain, undissipated, causing flux traps that can deleteriously affect the operation of the superconducting circuit after the superconducting circuit is reduced to the cryogenic temperature.

SUMMARY

One example includes a superconducting circuit. The circuit includes superconducting circuitry fabricated in a circuit layer. The circuit layer includes a first surface and a second surface opposite the first surface. The circuit also includes a flux moat comprising a dielectric material formed in the circuit layer. The flux moat can be configured to trap a magnetic flux as the superconducting circuit is cooled to below a superconducting critical temperature. The circuit further includes a magnetic film arranged proximal to the flux moat on at least one of the first and second surfaces of the circuit layer. The magnetic film can be configured to guide the magnetic flux to the flux moat as the superconducting circuit is cooled to below the superconducting critical temperature.

Another example described herein includes a method for fabricating a superconducting circuit. The method includes forming superconducting circuitry in a circuit layer. The circuit layer includes a first surface and a second surface opposite the first surface. The method also includes forming a flux moat comprising a dielectric material in the circuit layer. The flux moat can be configured to trap a magnetic flux as the superconducting circuit is cooled to below a superconducting critical temperature. The method further includes depositing a magnetic film proximal to the flux moat on at least one of the first and second surfaces of the circuit layer. The magnetic film can be configured to guide the magnetic flux to the flux moat as the superconducting circuit is cooled to below the superconducting critical temperature.

Another example described herein includes a superconducting circuit. The circuit includes superconducting circuitry fabricated in a circuit layer. The circuit layer includes a first surface and a second surface opposite the first surface. The circuit also includes a flux moat comprising a dielectric material formed in the circuit layer. The flux moat can be configured to trap a magnetic flux as the superconducting circuit is cooled to below a superconducting critical temperature. The circuit further includes a perpendicular magnetic anisotropy (PMA) material film arranged over the flux moat on at least one of the first and second surfaces of the circuit layer. The magnetic film can be configured to guide the magnetic flux to the flux moat as the superconducting circuit is cooled to below the superconducting critical temperature.

DETAILED DESCRIPTION

Figure 1:
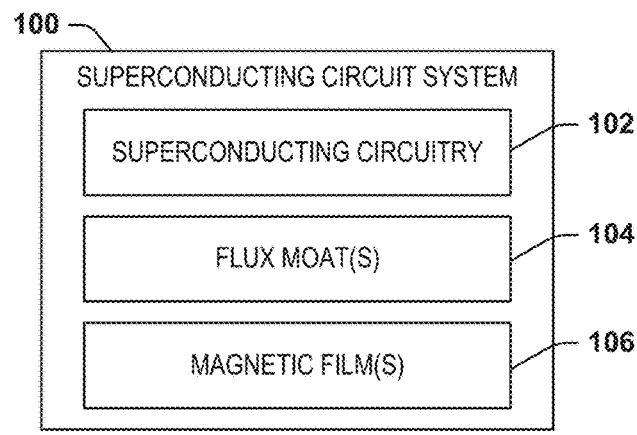
FIG. 1 is an example of a block diagram of a superconducting circuit.

This description relates generally to electronic circuits, and more particularly to flux-trapping magnetic films for superconducting circuits. A superconducting circuit described herein can include superconducting circuitry that is fabricated in a circuit layer that includes a first surface and a second surface that is opposite the first surface. As described herein, the term "circuit layer" can refer to a wafer or die layer in which the superconducting circuit is fabricated in layers composed of metals (e.g., superconducting metals) and dielectric materials. Therefore, the first and second surfaces can correspond to opposing surfaces of a wafer or die in which the superconducting circuit is fabricated. The superconducting circuit can also include one or more flux moats. The flux moats can be formed as a well of dielectric material that extends between the first and second surfaces of the circuit layer and is arranged between areas of the circuit layer in which the superconducting circuitry is fabricated. The flux moat can be configured to trap magnetic flux that is exhibited in the superconducting circuitry as the superconducting circuit is cooled to a cryogenic temperature at which the superconducting circuit operates. As a result, spurious magnetic flux that could exhibit in the superconducting circuitry is relocated to the flux moat, thus mitigated deleterious effects of magnetic flux in the superconducting circuitry which can degrade device performance during operation of the superconducting circuitry in the cryogenic temperature.

In a typical superconducting circuit design, the flux moat regions can be designed to be energetically favorable for the trapping of magnetic flux as the superconducting circuit cools below a critical superconducting temperature. However, some magnetic flux can still be trapped at sites in the superconducting circuitry other than the flux moats. Such a flux trapping process can be stochastic based on a reliance in the relative energies of the flux trapping locations as the circuit is cooled through the critical superconducting temperature. Defects in the superconducting materials and certain circuit topologies can inadvertently create sites that are more energetically favorable for flux trapping, thus competing with the flux moats for favorability in flux trapping.

To provide for a more deterministic flux trapping in the flux moats, as described herein, the superconducting circuit can include magnetic films that are formed proximal to (e.g., over) the flux moats on at least one of the surfaces of the circuit layer. As an example, the magnetic films can be formed from a perpendicular magnetic anisotropic (PMA) material having a magnetization that is orthogonal to the plane of the respective surface of the circuit layer. For example, the superconducting circuit can include multiple magnetic films formed over each of the flux moats on each of the first and second surface of the circuit layer. Therefore, the magnetic films can provide for a stronger favorability in flux trapping of the magnetic flux in the superconducting circuitry to the flux moats as the superconducting circuit is cooled to the cryogenic temperature.

FIG. 1 is an example of a block diagram of a superconducting circuit system 100. The superconducting circuit system 100 can be implemented in any of a variety of superconducting applications, such as a superconducting computer system. The superconducting circuit system 100 includes superconducting circuitry 102, at least one flux moat 104, and at least one magnetic film 106. The superconducting circuitry 102 can be fabricated in a circuit layer that includes a first surface and a second surface that is opposite the first surface. The flux moat(s) 104 can be formed as a well of dielectric material that extends between the first and second surfaces of the circuit layer and is arranged between areas of the circuit layer in which the superconducting circuitry 102 is fabricated. The flux moat(s) 104 can be configured to trap magnetic flux that is exhibited in the superconducting circuitry 102 as the superconducting circuit system 100 is cooled to a cryogenic temperature at which the superconducting circuit operates. As a result, spurious magnetic flux that could exhibit in the superconducting circuitry 102 is relocated to the flux moat(s) 104, thus mitigated deleterious effects of magnetic flux in the superconducting circuitry 102 which can degrade device performance during operation of the superconducting circuitry 102 in the cryogenic temperature.

The magnetic film(s) 106 are configured to provide a more deterministic, and thus less stochastic, process of trapping the magnetic flux in the flux moat(s) 104. As an example, the magnetic film(s) 106 can be formed proximal to (e.g., over) the flux moat(s) 104 on at least one of the surfaces of the circuit layer. For example, the magnetic film(s) 106 can be formed from a perpendicular magnetic anisotropic (PMA) material having a magnetization that is orthogonal to the plane of the respective surface of the circuit layer. The superconducting circuit system 100 can include multiple magnetic films 106 formed over each of the flux moat(s) 104 on each of the first and second surface of the circuit layer. Therefore, the magnetic film(s) 106 can provide for a stronger favorability in flux trapping of the magnetic flux in the superconducting circuitry 102 to the flux moat(s) 104 as the superconducting circuit system 100 is cooled to the cryogenic temperature.

Figure 2:
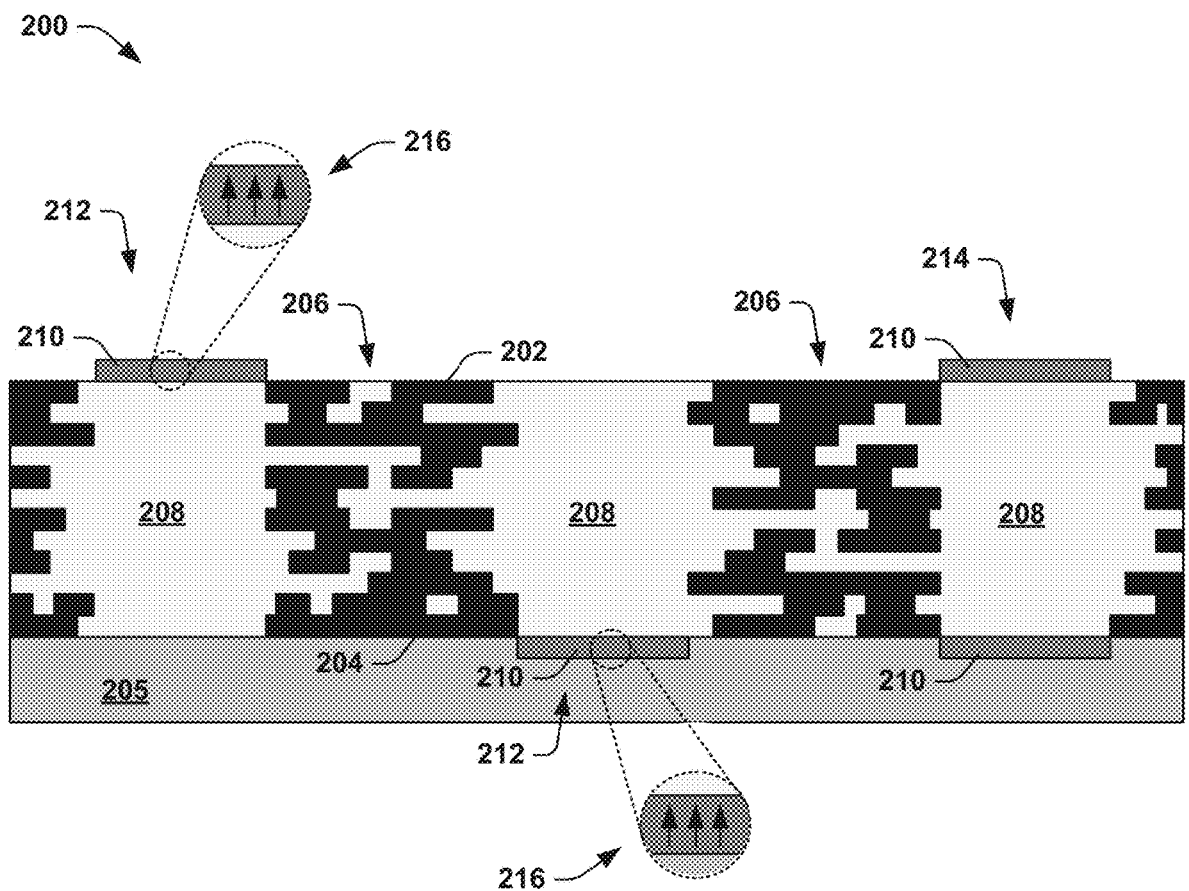
FIG. 2 is an example diagram of a superconducting circuit.

FIG. 2 is an example diagram of a superconducting circuit 200. The superconducting circuit 200 is demonstrated in a cross-sectional view of a circuit layer that can extend farther in each of opposing lateral directions. The circuit layer includes a first surface 202 and a second surface 204 that is opposite the first surface 202. The circuit layer is demonstrated as fabricated on a substrate 205 in the example of FIG. 2. The superconducting circuit 200 can correspond to the superconducting circuit system 100 in the example of FIG. 1. Therefore, reference is to be made to the example of FIG. 1 in the following description of the example of FIG. 2.

In the example of FIG. 2, the superconducting circuit 200 includes superconducting circuitry 206 distributed in multiple locations in the circuit layer. Between each set of superconducting circuitry 206, the superconducting circuit 200 includes a flux moat 208. The flux moat 208 is demonstrated as a portion of the circuit layer that extends between the first and second surfaces 202 and 204 of the circuit layer and is arranged between or adjacent to a set of the superconducting circuitry 206. As an example, each of the flux moats 208 can include nothing but a dielectric material in the portion of the respective flux moat 208 between the first and second surfaces 202 and 204. As described above, the flux moats 208 can each be configured to trap magnetic flux that is exhibited in the superconducting circuitry 206 as the superconducting circuit 200 is cooled to a cryogenic temperature at which the superconducting circuit operates.

In the example of FIG. 2, the superconducting circuit 200 includes magnetic films 210 that are arranged on the surfaces 202 and 204 of the circuit layer. As a first example, demonstrated generally at 212, a single magnetic film 210 can be arranged on one of the first surface 202 or the second surface 204. As a second example, demonstrated generally at 214, a magnetic film 210 can be formed over a given flux moat 208 on both the first surface 202 and the second surface 204. For example, the magnetic films 210 can be formed from a PMA material having a magnetization that is orthogonal to the plane of the respective surfaces 202 and 204 of the circuit layer. For example, the magnetic films can be formed from one of cobalt-platinum (CoPt), cobalt-palladium (CoPd), terbium-iron (TbFe), or a variety of other PMA materials. The magnetization is demonstrated at exploded views 216 in which the magnetization is demonstrated as being oriented perpendicular to the respective surfaces 202 and 204. While the direction of the magnetization is demonstrated in the example of FIG. 2 as being oriented away from the substrate 205, the magnetization direction can instead be the oriented toward the substrate 205. For the second example 214 of the magnetic films 210, the direction of the magnetization of the magnetic films 210 can be the same direction for aligned polarity.

The arrangement of the magnetic films 210 proximal to (e.g., over) the flux moats 208 can thus provide for a more deterministic, and thus less stochastic, process of trapping the magnetic flux in the flux moats 208. For example, the magnetic films (e.g., formed from a PMA material) can exhibit a high magneto-crystalline anisotropy, and can thus overcome the demagnetization field which would normally make the magnetization to lie in the plane of the magnetic film 210. Therefore, the magnetic films 210 provide more favorability of trapping the magnetic flux in the flux moats 208.

As opposed to a typical superconducting circuit system, the magnetic films 210 can provide for a stronger favorability in flux trapping of the magnetic flux from the superconducting circuitry 206 to the flux moats 208 as the superconducting circuit 200 is cooled to the cryogenic temperature. Additionally, by forming the magnetic film 210 over the flux moat 208, the high permeability material and the superconducting circuitry 206 can be confined to separate regions in the circuit layer which minimizes the possibility of the high permeability material impacting the performance of the superconducting circuitry 206. Accordingly, the magnetic films 210 of the superconducting circuit 200 can be more effective than typical superconducting circuits in mitigating magnetic flux in the superconducting circuitry 206 as the superconducting circuit 200 is cooled to cryogenic temperatures.

Figure 3:
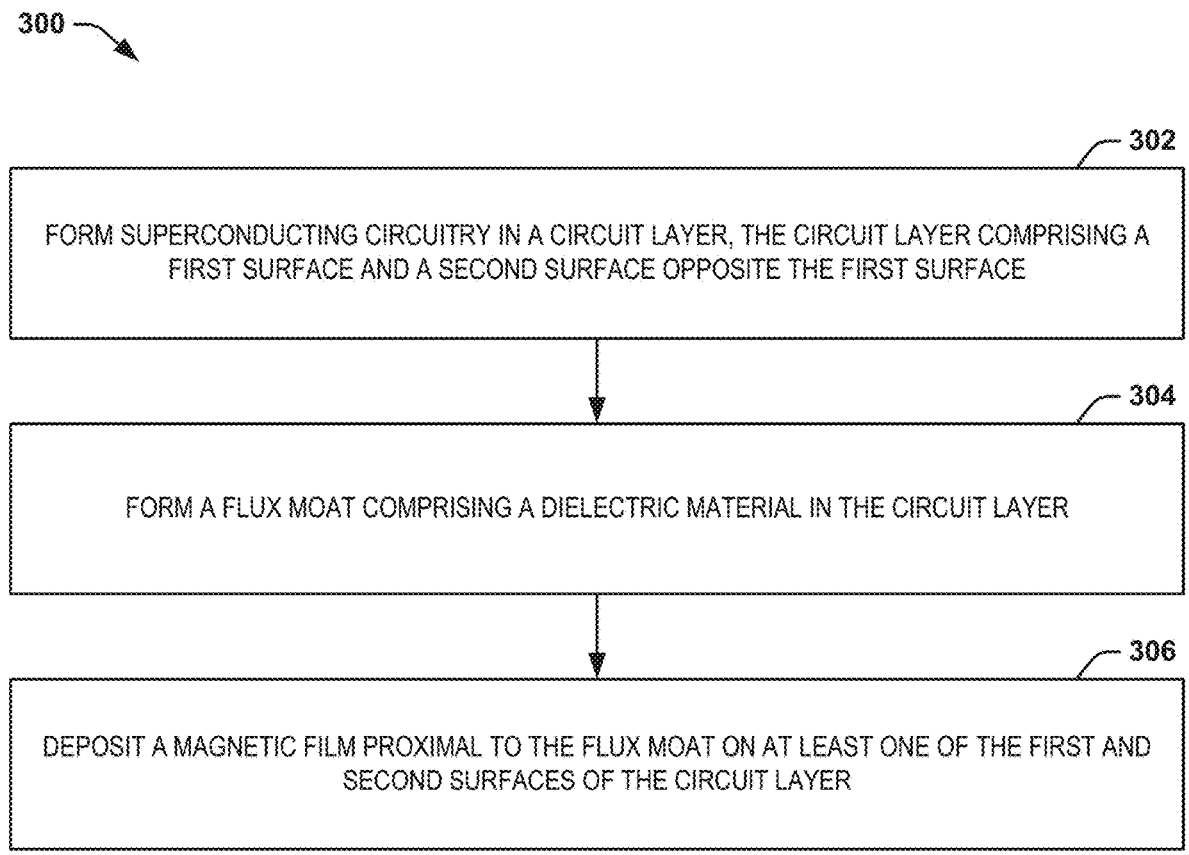
FIG. 3 is an example of a method for fabricating a superconducting circuit.

In view of the foregoing structural and functional features described above, a methodology in accordance with various aspects of the present invention will be better appreciated with reference to FIG. 3. While, for purposes of simplicity of explanation, the methodology of FIG. 3 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 3 is an example of a method 300 for fabricating a superconducting circuit (e.g., the superconducting circuit system 100). At 302, superconducting circuitry (e.g., the superconducting circuitry 102) is formed in a circuit layer. The circuit layer includes a first surface (e.g., the first surface 202) and a second surface (e.g., the second surface 204) opposite the first surface. At 304, a flux moat (e.g., the flux moat(s) 104) comprising a dielectric material is formed in the circuit layer. The flux moat can be configured to trap a magnetic flux as the superconducting circuit is cooled to below a superconducting critical temperature. At 306, a magnetic film (e.g., the magnetic film(s) 106) is deposited proximal to the flux moat on at least one of the first and second surfaces of the circuit layer. The magnetic film can be configured to guide the magnetic flux to the flux moat as the superconducting circuit is cooled to below the superconducting critical temperature.

What has been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A superconducting circuit comprising:
    superconducting circuitry fabricated in a circuit layer, the circuit layer comprising a first surface and a second surface opposite the first surface;
    a flux moat comprising a dielectric material formed in the circuit layer, the flux moat being configured to trap a magnetic flux as the superconducting circuit is cooled to below a superconducting critical temperature; and
    a magnetic film arranged proximal to the flux moat on at least one of the first and second surfaces of the circuit layer, the magnetic film being configured to guide the magnetic flux to the flux moat as the superconducting circuit is cooled to below the superconducting critical temperature.

2. The circuit of claim 1, wherein the magnetic film is formed from a perpendicular magnetic anisotropy (PMA) material.

3. The circuit of claim 2, wherein the PMA material has a magnetization that is orthogonal to the respective one of the first and second surface of the circuit layer.

4. The circuit of claim 2, wherein the PMA material is one of cobalt-platinum (CoPt), cobalt-palladium (CoPd), and terbium-iron (TbFe).

5. The circuit of claim 1, wherein the magnetic film is formed on the at least one of the first and second surfaces of the circuit layer over the flux moat.

6. The circuit of claim 1, wherein the magnetic film comprises:
    a first magnetic film arranged proximal to the flux moat on the first surface of the circuit layer; and
    a second magnetic film arranged proximal to the flux moat on the second surface of the circuit layer.

7. The circuit of claim 6, wherein the first magnetic film is arranged over the flux moat on the first surface of the circuit layer and the second magnetic film arranged over the flux moat on the second surface of the circuit layer opposite the first magnetic film.

8. The circuit of claim 1, wherein the flux moat is arranged between a first set of the superconducting circuitry and a second set of the superconducting circuitry in the circuit layer.

9. The circuit of claim 1, wherein the superconducting circuit comprises:
    a plurality of flux moats arranged between sets of superconducting circuitry, each of the flux moats comprising the dielectric material formed in the circuit layer; and
    a plurality of magnetic films, each of the magnetic films being arranged proximal to one of the flux moats on one of the first and second surfaces of the circuit layer.

10. A method for fabricating a superconducting circuit, the method comprising:
    forming superconducting circuitry in a circuit layer, the circuit layer comprising a first surface and a second surface opposite the first surface;
    forming a flux moat comprising a dielectric material in the circuit layer, the flux moat being configured to trap a magnetic flux as the superconducting circuit is cooled to below a superconducting critical temperature; and
    depositing a magnetic film proximal to the flux moat on at least one of the first and second surfaces of the circuit layer, the magnetic film being configured to guide the magnetic flux to the flux moat as the superconducting circuit is cooled to below the superconducting critical temperature.

11. The method of claim 10, wherein depositing the magnetic film comprises the depositing a perpendicular magnetic anisotropy (PMA) material film.

12. The method of claim 11, wherein the PMA material has a magnetization that is orthogonal to the respective one of the first and second surface of the circuit layer.

13. The method of claim 10, wherein depositing the magnetic film comprises depositing the magnetic film on the at least one of the first and second surfaces of the circuit layer over the flux moat.

14. The method of claim 10, wherein depositing the magnetic film comprises:
    depositing a first magnetic film over the flux moat on the first surface of the circuit layer; and
    depositing a second magnetic film over the flux moat on the second surface of the circuit layer.

15. The method of claim 10, wherein forming the superconducting circuitry comprises forming a first set of superconducting circuitry in the circuit layer and forming a second set of superconducting circuitry in the circuit layer, wherein forming the flux moat comprises forming the flux moat between the first set of superconducting circuitry and the second set of superconducting circuitry in the circuit layer.

16. A superconducting circuit comprising:
   superconducting circuitry fabricated in a circuit layer, the circuit layer comprising a first surface and a second surface opposite the first surface;
   a flux moat comprising a dielectric material formed in the circuit layer, the flux moat being configured to trap a magnetic flux as the superconducting circuit is cooled to below a superconducting critical temperature; and
   a perpendicular magnetic anisotropy (PMA) material film arranged over the flux moat on at least one of the first and second surfaces of the circuit layer, the PMA material film being configured to guide the magnetic flux to the flux moat as the superconducting circuit is cooled to below the superconducting critical temperature.

17. The circuit of claim 16, wherein the PMA material film has a magnetization that is orthogonal to the respective one of the first and second surface of the circuit layer.

18. The circuit of claim 16, wherein the PMA material film is formed from one of cobalt-platinum (CoPt), cobalt-palladium (CoPd), and terbium-iron (TbFe).

19. The circuit of claim 16, wherein the PMA material film comprises:
   a first PMA material film arranged over the flux moat on the first surface of the circuit layer; and
   a second PMA material film arranged over the flux moat on the second surface of the circuit layer.

20. The circuit of claim 16, wherein the flux moat is arranged between a first set of the superconducting circuitry and a second set of the superconducting circuitry in the circuit layer.

* * * * *